United States Patent
Gambino et al.

(10) Patent No.: US 10,177,000 B2
(45) Date of Patent: *Jan. 8, 2019

(54) SEMICONDUCTOR STRUCTURES HAVING LOW RESISTANCE PATHS THROUGHOUT A WAFER

(71) Applicant: INTERNATIONAL BUSINESS MACHINES CORPORATION, Armonk, NY (US)

(72) Inventors: Jeffrey P. Gambino, Portland, OR (US); Thomas J. Hartswick, Underhill, VT (US); Zhong-Xiang He, Essex Junction, VT (US); Anthony K. Stamper, Williston, VT (US); Eric J. White, Charlotte, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/425,005

(22) Filed: Feb. 6, 2017

(65) Prior Publication Data

US 2017/0148672 A1     May 25, 2017

Related U.S. Application Data

(60) Continuation of application No. 14/832,021, filed on Aug. 21, 2015, now Pat. No. 9,620,371, which is a
(Continued)

(51) Int. Cl.
*H01L 21/78* (2006.01)
*H01L 21/288* (2006.01)
(Continued)

(52) U.S. Cl.
CPC ............ *H01L 21/2885* (2013.01); *C25D 3/38* (2013.01); *C25D 5/10* (2013.01); *C25D 7/123* (2013.01); *H01L 21/288* (2013.01); *H01L 21/2855* (2013.01); *H01L 21/28518* (2013.01); *H01L 21/28556* (2013.01); *H01L 21/28568* (2013.01);
(Continued)

(58) Field of Classification Search
CPC . H01L 21/78; H01L 21/76898; H01L 23/585; H01L 24/95
See application file for complete search history.

(56) References Cited

U.S. PATENT DOCUMENTS 6,132,587 A    10/2000   Jorne et al.
6,251,238 B1   6/2001    Kaufman et al.
(Continued)

OTHER PUBLICATIONS

Notice of Allowance in related U.S. Appl. No. 15/178,893 dated Feb. 22, 2017, 22 pages.
(Continued)

*Primary Examiner* — Phat X Cao
(74) *Attorney, Agent, or Firm* — Steven Meyers; Andrew M. Calderon; Roberts Mlotkowski Safran Cole & Calderon, P.C.

(57) ABSTRACT

A semiconductor structure with low resistance conduction paths and methods of manufacture are disclosed. The method includes forming at least one low resistance conduction path on a wafer, and forming an electroplated seed layer in direct contact with the low resistance conduction path.

13 Claims, 5 Drawing Sheets

Related U.S. Application Data division of application No. 14/281,166, filed on May 19, 2014, now Pat. No. 9,312,140.

(51) Int. Cl.

| | | |
|---|---|---|
| *H01L 21/768* | (2006.01) | |
| *H01L 23/522* | (2006.01) | |
| *H01L 23/00* | (2006.01) | |
| *H01L 23/485* | (2006.01) | |
| *H01L 23/532* | (2006.01) | |
| *H01L 21/3205* | (2006.01) | |
| *H01L 21/285* | (2006.01) | |
| *H01L 23/58* | (2006.01) | |
| *H01L 23/528* | (2006.01) | |
| *C25D 7/12* | (2006.01) | |
| *C25D 3/38* | (2006.01) | |
| *C25D 5/10* | (2006.01) | |

(52) U.S. Cl.
CPC .... *H01L 21/32053* (2013.01); *H01L 21/7685* (2013.01); *H01L 21/76802* (2013.01); *H01L 21/76843* (2013.01); *H01L 21/76846* (2013.01); *H01L 21/76873* (2013.01); *H01L 21/76877* (2013.01); *H01L 21/76879* (2013.01); *H01L 21/76883* (2013.01); *H01L 21/76885* (2013.01); *H01L 21/76886* (2013.01); *H01L 21/76898* (2013.01); *H01L 21/78* (2013.01); *H01L 23/485* (2013.01); *H01L 23/522* (2013.01); *H01L 23/528* (2013.01); *H01L 23/5226* (2013.01); *H01L 23/53209* (2013.01); *H01L 23/53238* (2013.01); *H01L 23/585* (2013.01); *H01L 24/95* (2013.01); *H01L 2225/06541* (2013.01); *H01L 2924/0002* (2013.01)

(56) References Cited

U.S. PATENT DOCUMENTS

| | | |
|---|---|---|
| 6,270,646 B1 | 8/2001 | Walton et al. |
| 6,326,701 B1 | 12/2001 | Shinogi et al. |
| 6,773,571 B1 | 8/2004 | Mayer et al. |
| 6,774,039 B1 | 8/2004 | Drewery |
| 7,341,948 B2 | 3/2008 | Ponoth et al. |
| 7,586,175 B2* | 9/2009 | Lee .................. H01L 23/53238 257/620 |
| 7,967,969 B2 | 6/2011 | Mayer et al. |
| 8,242,578 B2 | 8/2012 | Basker et al. |
| 8,475,644 B2 | 7/2013 | Mayer et al. |
| 9,620,371 B2* | 4/2017 | Gambino ............ H01L 21/2885 |
| 2002/0192924 A1 | 12/2002 | Hwang et al. |
| 2005/0280120 A1* | 12/2005 | Tomita ................. H01L 23/522 257/620 |
| 2007/0063317 A1 | 3/2007 | Kim et al. |
| 2007/0072413 A1 | 3/2007 | Choi et al. |
| 2008/0299718 A1 | 12/2008 | Jiang et al. |
| 2009/0020800 A1 | 1/2009 | Tempel et al. |
| 2009/0149020 A1* | 6/2009 | Hayashi ................. C23C 16/14 438/653 |
| 2010/0013059 A1* | 1/2010 | Hsieh ..................... H01L 21/78 257/620 |
| 2010/0102317 A1* | 4/2010 | Han ......................... H01L 22/34 257/48 |
| 2010/0164113 A1 | 7/2010 | Cho |
| 2011/0244677 A1 | 10/2011 | Owada |
| 2011/0303960 A1 | 12/2011 | Cao et al. |
| 2012/0024368 A1 | 2/2012 | Sauar et al. |
| 2012/0199905 A1 | 8/2012 | Nitta |
| 2013/0207193 A1 | 8/2013 | Haneda et al. |
| 2013/0328198 A1 | 12/2013 | Chou et al. |
| 2014/0061940 A1 | 3/2014 | Kitao et al. |
| 2014/0138848 A1 | 5/2014 | Matsuura |
| 2014/0231986 A1 | 8/2014 | Dubin |
| 2014/0264641 A1* | 9/2014 | Frohberg ............ H01L 29/4175 257/412 |

OTHER PUBLICATIONS

Fu et al., "Network Plating on Seed Layer to Improve Plating Uniformity", IP.com Electronic Publication No. IPCOM000109052D, Mar. 23, 2005, 2 pages.

Fu et al., "Technique to Improve Plating Base Conductivity for More Uniform Plating", IP.com Electronic Publication No. IPCOM000116403D, Mar. 30, 2005, 3 pages.

"List of IBM Patents or Patent Applications Treated as Related" 1 page.

Office Action in related U.S. Appl. No. 14/832,024 dated Apr. 19, 2017, 19 pages.

Office Action in related U.S. Appl. No. 14/832,024 dated Oct. 2, 2017, 11 pages.

Final Office Action in related U.S. Appl. No. 14/832,024 dated Jun. 4, 2018, 19 pages.

Office Action dated Jan. 30, 2018 in related U.S. Appl. No. 14/832,024, 16 pages.

Office Action in related U.S. Appl. No. 14/832,024 dated Sep. 19, 2018, 18 pages.

* cited by examiner

SEMICONDUCTOR STRUCTURES HAVING LOW RESISTANCE PATHS THROUGHOUT A WAFER

FIELD OF THE INVENTION

The invention relates to semiconductor structures and, more particularly, to a semiconductor structure with low resistance conduction paths and methods of manufacture.

BACKGROUND

Metal electro-plating is widely used for multi metal level electronic device fabrication. Electro-plating requires a low resistance conduction path between the electrodes providing the current and the entire surface of the device being plated. Resistance between the electrode contact point and any portion of the device can result in significant differences in the thickness of the plated metal across the device. Accordingly, in order to guarantee uniform plating, thick conducting seed layers are often required, which directly affect the cost and performance of the device.

SUMMARY

In an aspect of the invention, a method comprises forming at least one low resistance conduction path on a wafer, and forming an electroplated seed layer in direct contact with the low resistance conduction path.

In an aspect of the invention, a method comprises: forming at least one low resistance conduction path comprising at least one metal filled via within an insulator layer; and forming an electroplated seed layer on a patterned upper insulator layer, in direct contact with the least one metal filled via. The forming of the electroplated seed layer comprises: forming the upper insulator layer on the insulator layer; patterning the upper insulator layer to form an opening which exposes the at least one metal filled via; and forming the electroplated seed layer on a surface of the upper insulator layer including within the opening to directly contact the at least one metal filled via.

In an aspect of the invention, a structure comprises: at least one low resistance conduction path in a dielectric material, extending to an underlying substrate; and an electroplated seed layer in direct contact with the low resistance conduction path, provided on a surface of the dielectric material.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structure with low resistance conduction paths, which comprises the structures of the present invention. In still further embodiments, a method in a computer-aided design system is provided for generating a functional design model of the semiconductor structure with low resistance conduction paths. The method comprises generating a functional representation of the structural elements of the semiconductor structure with low resistance conduction paths.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
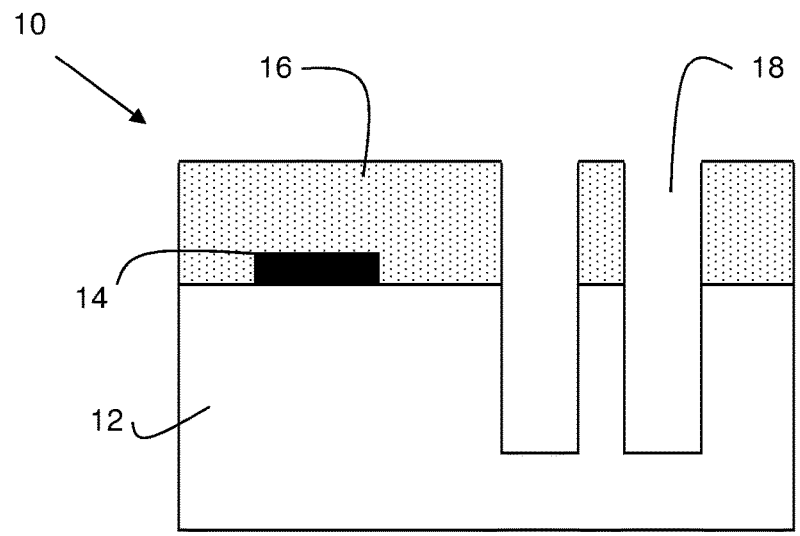
FIGS. 1-3 show structures and respective processing steps in accordance with aspects of the present invention.

The invention relates to semiconductor structures and, more particularly, to a semiconductor structure with low resistance conduction paths and methods of manufacturing. More specifically, the present invention provides structures with low resistance conduction paths, which effectively reduces thickness variability, e.g., cross device thickness variation, of electroplating material independent of a seed layer. The low resistance conduction paths allow the ability to use thin, highly resistive seed layers for electroplating of metal lines, etc.

As semiconductor technologies march toward smaller geometry, it is becoming ever more important to use thinner Cu seed layers. These Cu seed layers are typically formed using electroplating processes, which exhibit much better electromigration (EM) lifetime than PVD (plasma vapor deposition) Cu seed layers. Also, PVD seed layers cannot pinch off wires or vias, compared to electroplating processes.

By introducing low resistance conduction paths of the present invention, it is now possible to use thinner seed layers, while maintaining metal thickness uniformity in a center of a wafer during electroplating processes. That is, advantageously, by implementing the aspects of the present invention, power can be easily transferred from a plating electrode throughout the whole wafer with thinner seed layers. This greatly reduces the resistance of small metal lines, reduces liner and seed removal processing for RDL (redistribution layer) (polymer defined plating) structures, and reduces plating and chemical mechanical polishing (CMP) time. Accordingly, use of the low resistance conduction paths of the present invention decreases overall resistance of the wafer, increases the electroplating plating rate and hence improves thickness uniformity in wafer center. Moreover, when BEOL (back end of the line) wiring structures are incorporated into electrical current conduction paths, the seed layer thickness of selective plating processes (e.g., RDL) can be minimized and hence less amount of seed removal is required.

In the present invention, the low resistance conduction paths can be provided by, e.g., deep vias, through silicon vias (TSV), or large metal structures (back end of the line (BEOL) wiring structures). In embodiments, the low resistance conduction paths can be provided in unused space in the dicing channels in order to convert this space to wire paths from the electrode (e.g., edge of wafer) throughout the wafer. This is especially effective with RF technologies due to thick wire levels used for power transfer and induction. Additionally, ground or power strips (wiring structures) within chip interiors can be designed and connected to accomplish the same objective such that electrical current can be more evenly distributed within chip interiors. The low resistance conduction paths can also be provided in regions between electronic devices and/or within dicing channels and/or inside chip interiors.

The structures of the present invention can be manufactured in a number of ways using a number of different tools. In general, though, the methodologies and tools are used to form structures with dimensions in the micrometer and nanometer scale. The methodologies, i.e., technologies, employed to manufacture the structures of the present invention have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

FIG. 1 shows a structure 10 comprising a substrate 12. The substrate 12 can be, for example, a silicon substrate; although other semiconductor materials are also contemplated by the present invention. In embodiments, the substrate 12 can have a thickness of about 700 microns to about 2 mm, depending on the design criteria. It should be understood by those of skill in the art that other dimensions can also be used with the present invention and that the dimensions of the substrate 12 should not be considered a limiting feature of the present invention. A passive structure or active device 14 can be fabricated on the substrate 12. In embodiments, the active device can be a transistor, e.g., FET; whereas, the passive structure can be a wiring structure, resistor, etc., all of which are fabricated in a conventional manner such that further explanation is not required for an understanding of the invention.

Still referring to FIG. 1, an interlevel dielectric material 16 is deposited on the substrate 12 using conventional deposition processes, e.g., chemical vapor deposition (CVD). In embodiments, the interlevel dielectric material 16 can be $SiO_2$; although other insulator materials are also contemplated by the present invention. The interlevel dielectric material 16 can be planarized using conventional CMP processes.

One or more vias 18 are formed through the interlevel dielectric material 16 and into the substrate 12 using conventional lithography and etching processes. By way of example, a photoresist can be deposited on the interlevel dielectric material 16, which is then exposed to light to form a pattern. The vias 18 can be formed through the pattern using a reactive ion etch (RIE) with appropriate etch chemistries for the interlevel dielectric material 16 and the substrate 12. In embodiments, the depth of the vias 18 can range from about 5 microns to about 200 microns, and the width or diameter of the vias 18 can range from about 0.5 microns to about 50 microns, depending on the thickness of the substrate 12, design criteria, etc. After the etching process, the resist can be removed using, for example, an oxygen ashing process. The vias 18 can be located within the dicing channel (scribe line), can be part of a crackstop guard ring or within the interior space of the chip, if space is available.

Figure 2:
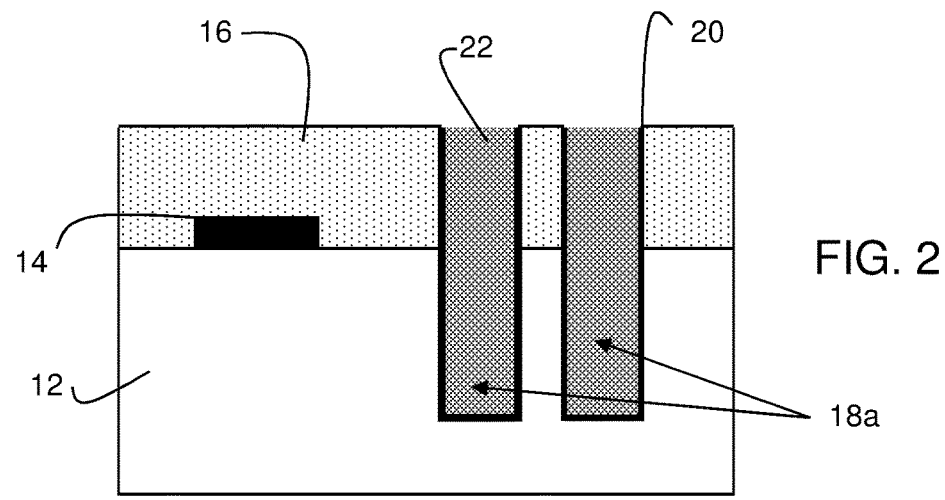

As shown in FIG. 2, the vias are filled with material to form a low resistance path 18a. By way of one illustrative example, an oxide material is deposited on the sidewalls of the vias using a Plasma Enhanced CVD (PECVD) process or sub atmospheric CVD process. The oxide material can be deposited to a thickness of about 1000 Å to about 5000 Å; although other thicknesses are also contemplated by the present invention. An adhesion layer, e.g., Ta or Ti, is deposited on the oxide material to a thickness of about 100 Å to about 1000 Å, using conventional sputtering techniques. A copper seed layer is depositing on the adhesion layer to a depth of about 1000 Å to about 1 micron, using conventional sputtering techniques. (The oxide material, adhesion layer and seed layer are represented by reference numeral 20.) A copper material 22 is deposited in the remaining unfilled portions of the via using an electroplating process. It should be understood by those of ordinary skill in the art that other conductive materials (metals or metal alloys) can be deposited into the via. A top surface of the filled via then undergoes a polishing process, e.g., CMP.

Figure 3:
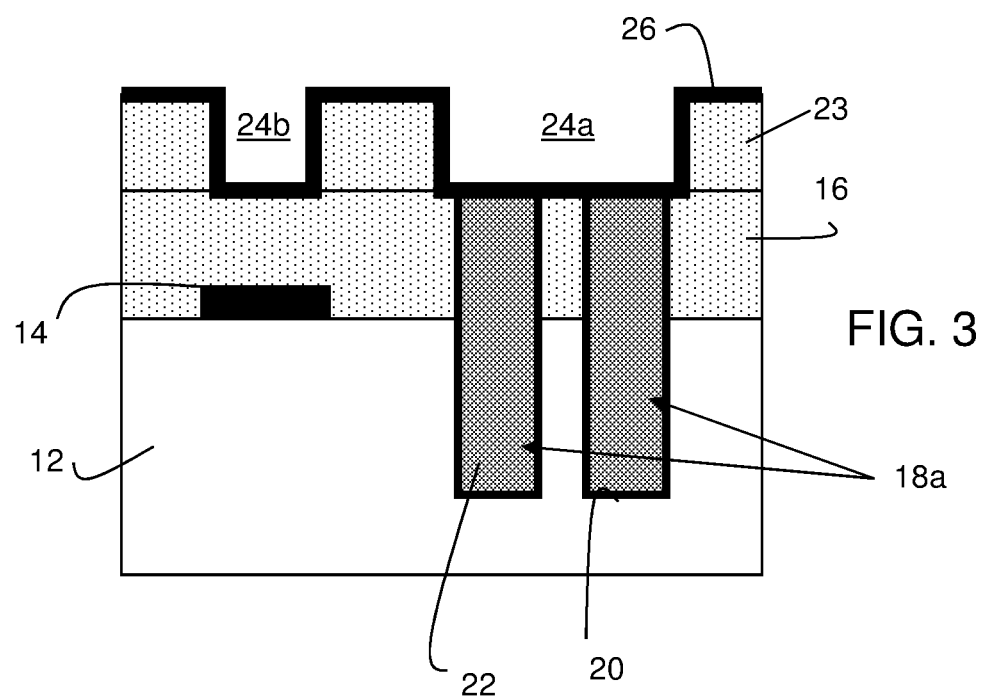

In FIG. 3, an interlevel dielectric material 23 is deposited on the interlevel dielectric material 16 and over the low resistance paths (e.g., filled vias) 18a. The interlevel dielectric material 23 can be $SiO_2$; although other insulator materials are also contemplated by the present invention. The interlevel dielectric material 23 can be planarized using conventional CMP processes, and patterned to form openings 24a, 24b. In embodiments, the opening 24a exposes the underlying conductive material of the low resistance paths 18a. The patterning can be provided by lithography and etching processes, as already described herein.

Still referring to FIG. 3, a seed layer and barrier layer 26 are then formed on the interlevel dielectric material 23 including on the sidewalls and bottom of the openings 24a, 24b. In this way, the seed layer and barrier layer 26 are in direct contact with the conductive material of the vias 18a. The seed layer is preferably copper (Cu). In embodiments, the Cu seed layer is a thin, highly resistive seed layer used for electroplating of metal lines or other device fabrication, etc. For example, the seed layer can have a thickness of about 10 nm. The barrier layer can be, for example, Ta, TaN or a bilayer of Ta/TaN, deposited using conventional deposition processes. An electroplating process is performed to form a metal layer on the seed layer 26.

As should be understood by those of skill in the art, the low resistance conduction paths 18a can be about 10 micron tall, with a resultant resistance of about 2 mΩ/□. The Cu seed layer can be about 10 nm in thickness with a resistance of about 18Ω/□. Assuming a 0.5% chip area designed with the low resistance conduction paths 18a, the resistive path of the wafer can be decreased to about 0.4Ω/□, which is about 45× lower resistance than a conventional wafer. Accordingly, by implementing the low resistance conduction paths, it is now possible to use thinner seed layers which greatly reduces the resistance of small metal lines, reduces liner and seed removal processing for RDL (redistribution layer) (polymer defined plating) structures, reduces plating and chemical mechanical polishing (CMP) time, and reduces cross device thickness variation of electroplating material in a center of a wafer. As to the latter point, the low resistance conduction paths (i) decrease overall resistance of the wafer, (ii) increase the electroplating plating rate and hence (ii) improves thickness uniformity in wafer center.

Figure 4:
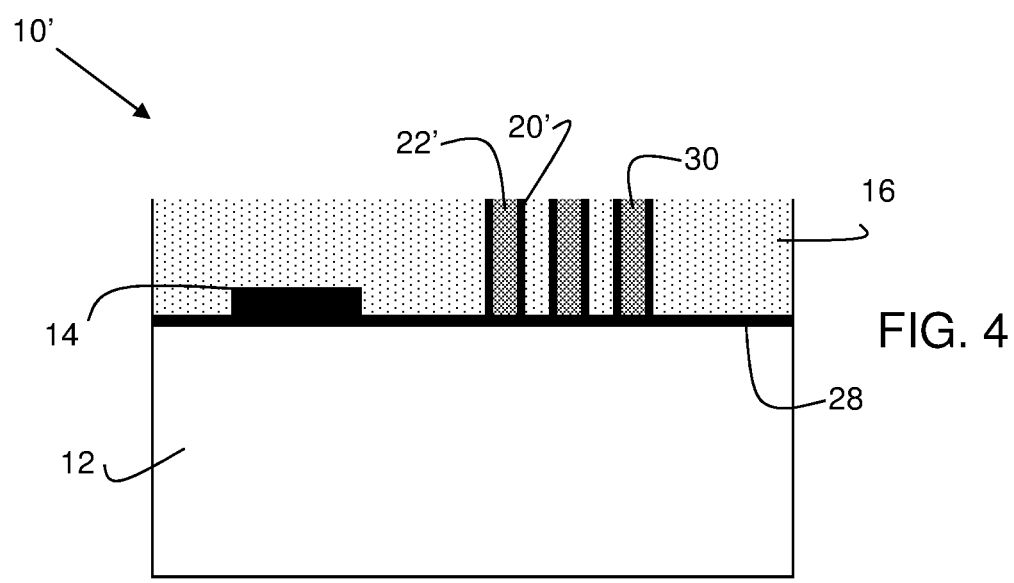
FIGS. 4 and 5 show structures and respective processing steps in accordance with additional aspects of the present invention.
Figure 5:
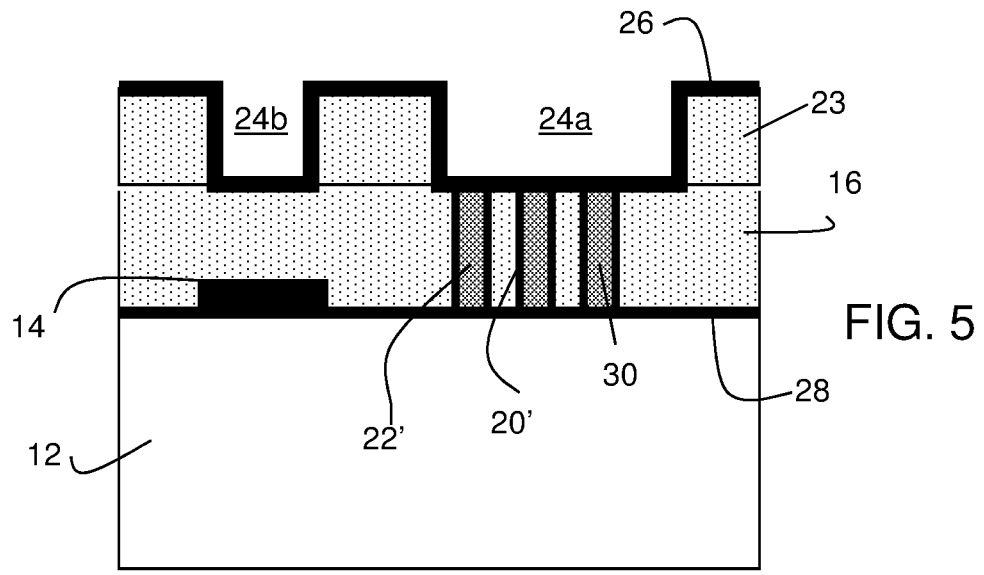

FIGS. 4 and 5 show structures and respective processing steps in accordance with additional aspects of the present invention. More specifically, FIG. 4 shows a structure 10' comprising a substrate 12 composed of silicon; although other semiconductor materials are also contemplated by the present invention. In embodiments, the substrate 12 can have a thickness of about 700 microns to about 2 mm, depending on the design criteria; however, these dimensions should not be considered a limiting feature of the present invention. A passive structure or active device 14 can be fabricated on the substrate 12 as described with respect to FIG. 1.

Still referring to FIG. 4, a silicide layer 28 is formed on the substrate 12 using conventional processes. For example, the silicide layer 28 can be formed by the reaction of a thin metal film (e.g., Ni, Co or Ti) with silicon through an annealing process. In embodiments, the silicide layer 28 can be provided in the dicing channel or in the chip area, itself, depending on available space, and will act as a conduction path for electroplating.

An interlevel dielectric material 16 is deposited on the silicide layer 28 using conventional deposition processes, e.g., CVD. In embodiments, the interlevel dielectric material 16 can be $SiO_2$; although other insulator materials are also contemplated by the present invention, e.g., BPSG (Boron Phosphate Silicate Glass). The interlevel dielectric material 16 can be planarized using conventional CMP processes and thereafter patterned to form one or more contacts 30, e.g., low resistance paths, contacting the silicide layer 28. The contacts 30 can be located within the dicing channel (scribe line), can be part of a crackstop guard ring or within the interior space of the chip, if space is available. In embodiments, the contacts 30 can range from about 0.5 microns to about 1.5 microns in depth, and from about 0.1 microns to about 2 microns in width.

The contacts 30 can be formed using conventional deposition, lithography and etching processes as already described herein. For example, after lithography and etching processes, the resulting vias are filled with metal material to form the contacts, e.g., the low resistance conduction paths. By way of one illustrative example, a conductive liner 20', e.g., Ti or TiN, is formed on sidewalls of the via using a sputtering or CVD process, followed by a deposition of tungsten or copper material 22' (using, e.g., a CVD process). The contacts 30 then undergo a polishing process, e.g., CMP.

In FIG. 5, an interlevel dielectric material 23 is deposited on the interlevel dielectric material 16 and over the low resistance paths (e.g., filled contacts) 30. The interlevel dielectric material 23 can be $SiO_2$, although other insulator materials are also contemplated by the present invention. The interlevel dielectric material 23 can be planarized using conventional CMP processes, and patterned to form openings 24a, 24b. In embodiments, the opening 24a exposes the underlying conductive material of the contacts 30. A seed layer and barrier layer (both represented at reference numeral 26) are formed on the interlevel dielectric material 23, and within the openings 24a, 24b. In this way, the seed layer, e.g., Cu, and barrier layer, e.g., Ta, TaN or a bilayer of Ta/TaN, are in direct contact with the conductive material of the contacts 30. An electroplating process is performed to form a metal layer on the seed layer 26.

As should be understood by those of skill in the art, the contacts 30 in combination with the silicide layer 28 are representative of low resistance conduction paths. In this example, the Cu seed layer 26 can have a thickness of about 10 nm with a resistance of about 18Ω/□. A Ni silicide layer has a resistance of about 3Ω/□. Assuming a 20% chip area designed with the Ni silicide layer, the resistive path of the wafer can be decreased to about 15Ω/□, which is about 50% lower resistance than a conventional wafer. As such, the low resistance conduction paths (i) decrease overall resistance of the wafer, (ii) increase the electroplating plating rate and hence (ii) improves thickness uniformity in wafer center.

Figure 6:
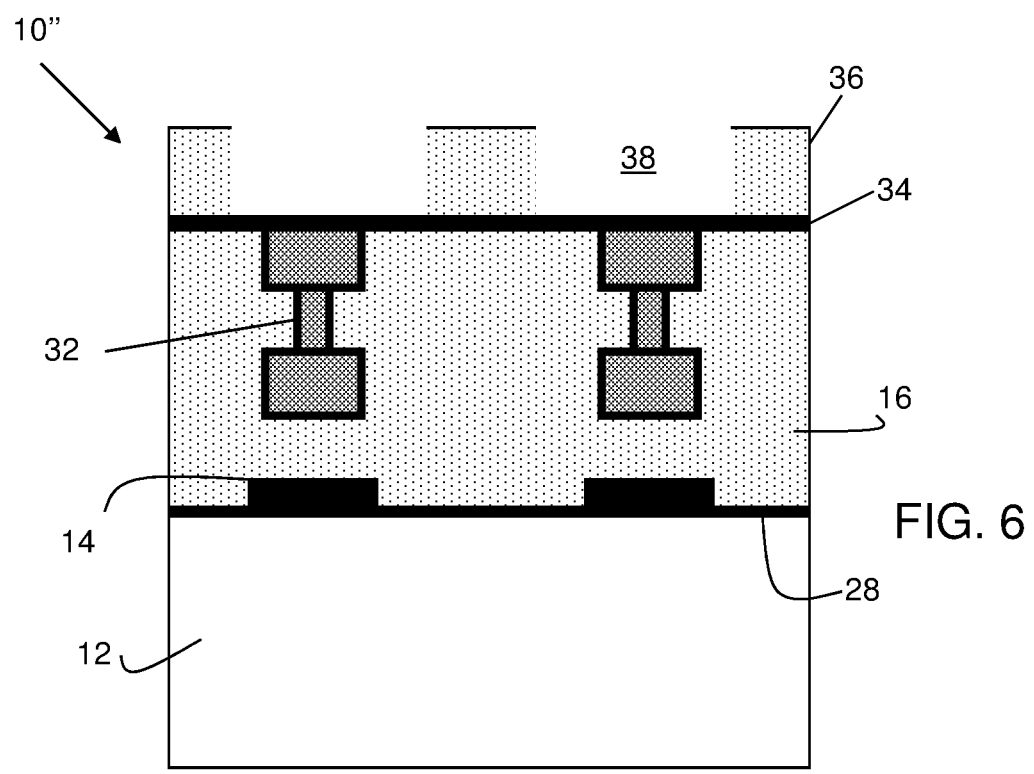
FIGS. 6 and 7 show structures and respective processing steps in accordance with further aspects of the present invention.
Figure 7:
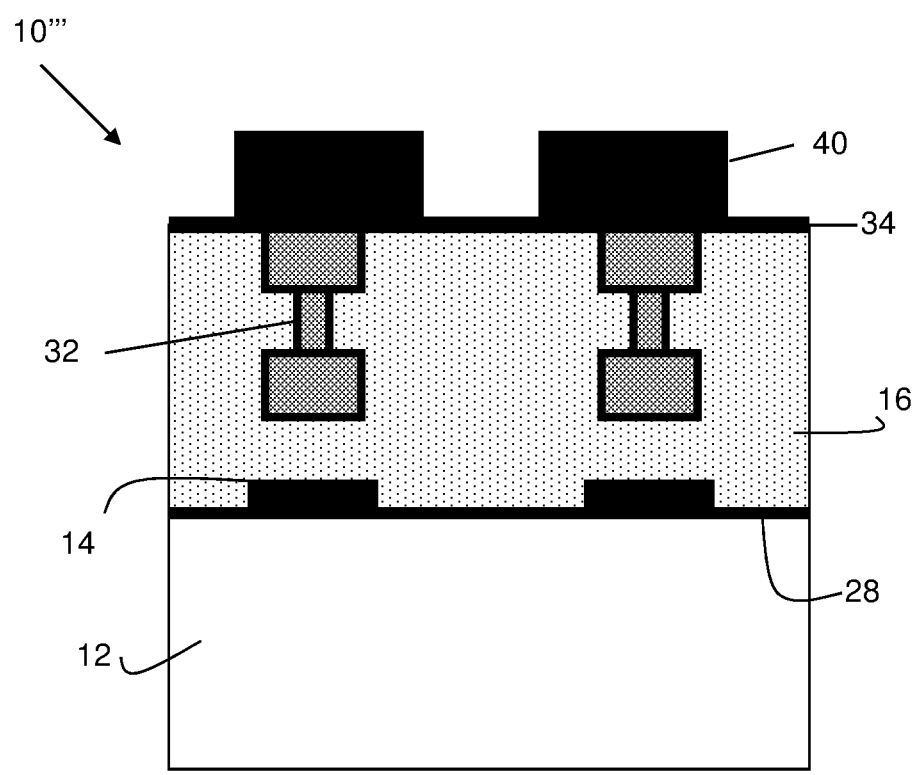

FIGS. 6 and 7 show structures and respective processing steps in accordance with further aspects of the present invention. More specifically, FIG. 6 shows a structure 10" comprising a substrate 12 composed of silicon; although other semiconductor materials are also contemplated by the present invention. In embodiments, the substrate 12 can have a thickness of about 700 microns to about 2 mm, depending on the design criteria; however, these dimensions should not be considered a limiting feature of the present invention. A plurality of any combination of passive structures and active devices 14 can be fabricated on the substrate 12 as described with respect to FIG. 1. A silicide layer 28 is formed on the substrate 12 using conventional processes. For example, the silicide layer 28 can be formed by the reaction of a thin metal film (e.g., Ni) with silicon through an annealing process. In embodiments, the silicide layer 28 can act as a conduction path for electroplating.

An interlevel dielectric material 16 is deposited on the substrate 12 using conventional deposition processes, e.g., CVD. In embodiments, the interlevel dielectric material 16 can be $SiO_2$, although other insulator materials are also contemplated by the present invention. One or more metal wiring and interconnects 32 are formed in the interlevel dielectric material 16. The metal wiring and interconnects 32 can be formed using conventional deposition, lithography and etching processes as already described herein. For example, after each layer of interlevel dielectric material 16 is deposited and planarized, a lithography, etching and deposition process can be performed to form the metal wiring and interconnects 32 at individual metal layers, Mx The metal wiring and interconnects 32 can be formed from any conductive material such as, for example, copper or tungsten.

Still referring to FIG. 6, a seed layer and barrier layer 34 are formed on the interlevel dielectric material 16, contacting the underlying metal wiring and interconnects 32. The seed layer, e.g., Cu, is in direct contact with the conductive material of the metal wiring and interconnects 32. In embodiments, the seed layer 34 has a thickness of about 500 Å to about 1 micron, which is considerably thinner than used with a conventional device. A resist 36 is deposited on the interlevel dielectric material 16 and over the seed layer and barrier layer 34. The resist layer 36 is then patterned to form openings 38.

In FIG. 7, a metal wiring 40 is formed in contact with the seed layer 34. The metal wiring 40 can be an embedded BEOL wiring structure inside the chip interior for chip power distribution and grounding, and simultaneously providing a lower Rs path for electroplating processes. The metal wiring 40 can be formed using any conventional BEOL process, e.g., preferably electroplating. In embodiments, the metal wiring 40 can be about 2 microns to about 100 microns in thickness; although other dimensions are also contemplated by the present invention.

After formation of the metal wiring 40, the resist can be removed by a conventional oxygen ashing or stripping process. The exposed portions of the seed layer and barrier layer 34 can also be removed by a short wet etch process. This short wet etch will not remove the metal wiring 40 due to its overall thickness compared to the seed layer and barrier layer 34, as should be understood by those of skill in the art. As should be further understood by those of skill in the art, the use of the BEOL Mx wires, e.g., metal wires 40, allows a reduction in the thickness of the seed layer 34. This reduced thickness, in turn, results in easier removal of the seed layer in subsequent processing steps, and also less lateral CD loss. Also, the low resistance conduction paths, e.g., metal wiring, (i) decrease overall resistance of the wafer, (ii) increase the electroplating plating rate and hence (ii) improves thickness uniformity in wafer center.

Figure 8:
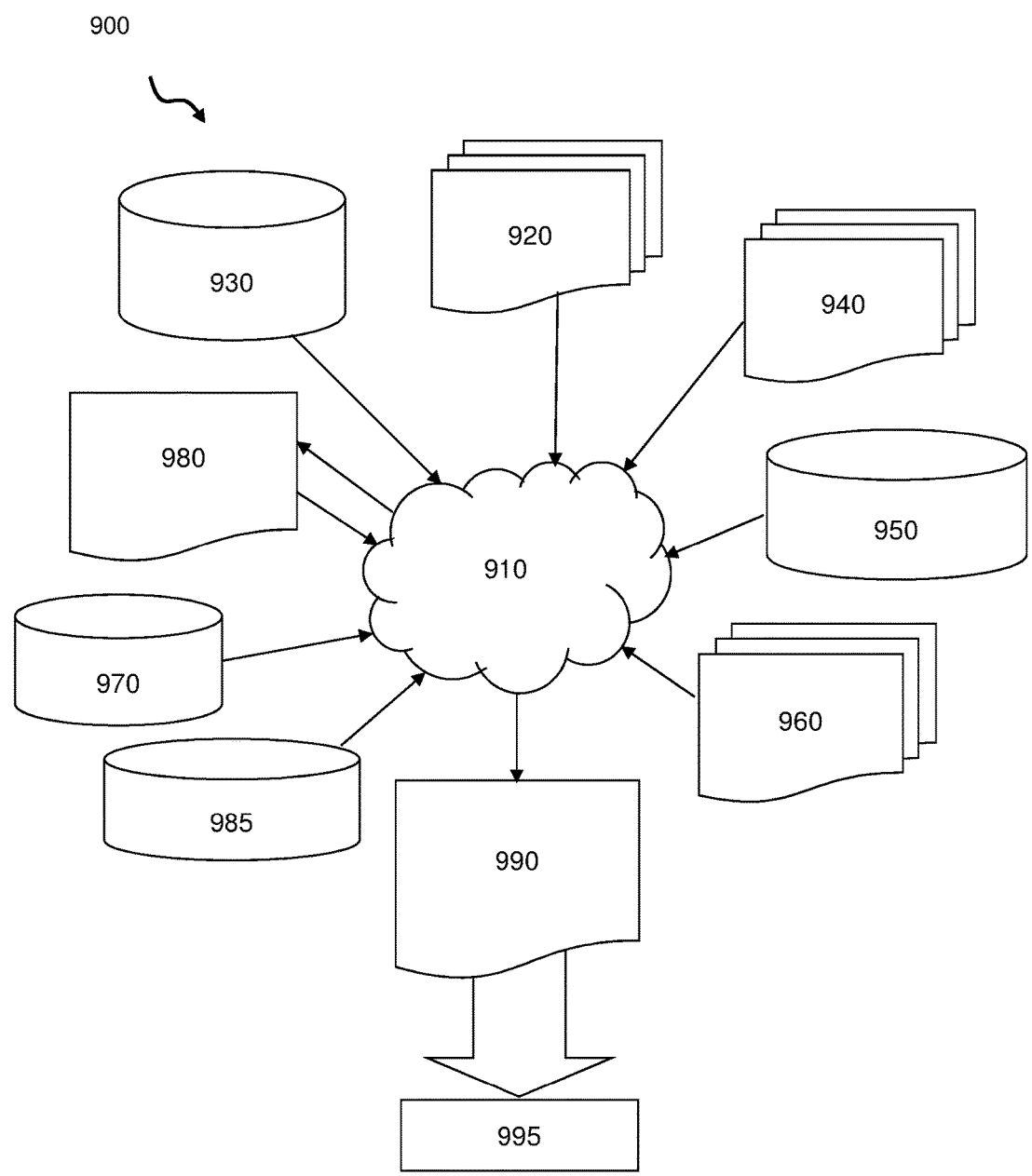
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 990 may comprise a compiled, executable HDL simulation model that functionally simulates the devices shown in FIGS. 1-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a silicide layer on a substrate;
   forming a low resistance conduction path in a dicing channel in an interlevel dielectric layer above the silicide layer;
   forming an active device on the substrate and in contact with the silicide layer;
   forming a second interlevel dielectric layer over the interlevel dielectric layer;
   patterning the second interlevel dielectric layer to form a first opening exposing the low resistance conduction path and a second opening above the active device;
   forming a barrier layer on sidewalls and bottoms of the first and second openings and in contact with the low resistance conduction path; and
   forming a seed layer in contact with the barrier layer, wherein:
   the low resistance conduction path comprises a plurality of vias,
   the first opening is formed in the dicing channel on a side of the active device to expose all of the plurality of vias so that the barrier layer is formed in direct contact with material of the plurality of vias, and
   the forming the low resistance conduction path comprises etching the plurality of vias into the interlevel dielectric layer to the silicide layer and filling the plurality of vias with metal material to form metal contacts in direct contact with the silicide layer.

2. The method of claim 1, wherein the low resistance conduction path is provided into the interlevel dielectric material and contacts the silicide layer.

3. The method of claim 1, wherein the silicide layer is formed at a junction between the interlevel dielectric material and the underlying substrate.

4. The method of claim 1, wherein the silicide layer is formed by reaction of a thin metal film with silicon through an annealing process.

5. The method of claim 1, wherein the low resistance conduction path is part of a crackstop guard ring.

6. The method of claim 1, wherein the second interlevel dielectric layer is formed directly on the interlevel dielectric layer.

7. The method of claim 6, further comprising an electroplating process to form a metal layer on the seed layer.

8. The method of claim 7, wherein the vias of the plurality of vias are formed at one side of the active device.

9. A method, comprising:
   forming a silicide layer on a substrate;
   forming an active device on the substrate and in contact with the silicide layer;
   forming a low resistance conduction path remote from the active device in an interlevel dielectric layer above the silicide layer;
   forming a second interlevel dielectric layer over the interlevel dielectric layer;
   patterning the second interlevel dielectric layer to form a first opening exposing the low resistance conduction path;
   forming a barrier layer on sidewalls and a bottom of the first opening in contact with the low resistance conduction path; and
   forming a seed layer in contact with the barrier layer, wherein:
   the low resistance conduction path comprises a plurality of parallel vias,
   the first opening is formed in a dicing channel on a side of the active device to expose all of the plurality of parallel vias so that the barrier layer is formed in direct contact with material of the plurality of parallel vias, and
   the forming the low resistance conduction path comprises etching the plurality of parallel vias into the interlevel dielectric layer to the silicide layer and filling the plurality of parallel vias with metal material to form metal contacts in direct contact with the silicide layer.

10. The method of claim 9, further comprising patterning the second interlevel dielectric layer to form a second opening above the active device.

11. The method of claim 10, further comprising forming the barrier layer on sidewalls and a bottom of the second opening.

12. The method of claim 11, wherein the second interlevel dielectric layer is formed directly on the interlevel dielectric layer.

13. The method of claim 12, wherein the low resistance conduction path is formed at one side of the active device.

\* \* \* \* \*